United States Patent [19]

Johnson, Jr.

[11] Patent Number: 5,469,098
[45] Date of Patent: Nov. 21, 1995

[54] ISOLATED GATE DRIVE

[75] Inventor: Robert W. Johnson, Jr., Raleigh, N.C.

[73] Assignee: Exide Electronics Corporation, Raleigh, N.C.

[21] Appl. No.: 39,932

[22] Filed: Mar. 29, 1993

[51] Int. Cl.⁶ .................................................. H03K 3/16
[52] U.S. Cl. ......................... 327/190; 327/191; 327/109; 327/108
[58] Field of Search ................................. 307/282, 270; 328/65; 331/167, 172, 173, 117 R, 117 FE; 327/108, 109, 190, 191, 300, 304, 427

[56] References Cited

U.S. PATENT DOCUMENTS

| 3,760,198 | 9/1973 | Mori et al. | 307/268 |
|---|---|---|---|
| 3,863,180 | 1/1975 | Parson | 331/117 R |
| 4,009,454 | 2/1977 | Darrow | 331/117 R |
| 4,034,237 | 7/1977 | Minami | 307/282 |
| 4,177,393 | 12/1979 | Förster | 307/270 |
| 4,342,143 | 8/1982 | Jennings | 29/25.42 |
| 4,360,744 | 11/1982 | Taylor | 307/254 |
| 4,443,719 | 4/1984 | Planar et al. | 307/412 |
| 4,471,327 | 9/1984 | Moss | 331/117 R |
| 4,757,433 | 7/1988 | Santelmann, Jr. | 331/117 FE |
| 4,785,345 | 11/1988 | Rawls et al. | 357/51 |
| 4,803,453 | 2/1989 | Tomono | 336/183 |
| 4,959,630 | 9/1990 | Yerman et al. | 336/83 |

Primary Examiner—John S. Heyman
Assistant Examiner—Toan Tran
Attorney, Agent, or Firm—Woodcock Washburn Kurtz Mackiewicz & Norris

[57] ABSTRACT

A drive circuit for use in UPS and like devices, designed to derive high-level switching signals from low-level logic signals. The drive circuit has an input circuit which drives the primary of an air-core transformer, the input drive circuit having an oscillator with a resonant circuit producing a carrier at a carrier frequency, the resonant circuit including the primary of the transformer and a coupling circuit for coupling the logic signals to the oscillator so as to modulate the carrier signal. The use of the resonant circuit enables generation of sufficient magnetization current for the low-cost transformer while reducing the current drive required of the input drive circuit, thereby enabling a reduced cost gate drive circuit.

6 Claims, 3 Drawing Sheets

ISOLATED GATE DRIVE

FIELD OF THE INVENTION

This invention relates to circuits designed to provide isolated transfer of logic signals from low voltage level logic circuitry to relatively high voltage switching devices.

BACKGROUND OF THE INVENTION

A well known problem area in the design of power supplies and specifically in the area of interrupted power supplies, is that of connecting a low-level logic signal to a high voltage switch. Logic circuits produce low-level logic pulses referenced to ground of the logic circuit. Power supply devices have one or more switches which are to be operated by the logic signals, but which operate at high voltage, e.g., hundreds of volts from ground. A high voltage IGBT, MOSFET, etc. may typically require a 15 volt signal on its gate to turn it on, and 0 volt signal referenced to its own ground to turn it off. Accordingly, the output from the logic circuitry cannot simply be coupled straight through to the high voltage switching circuitry. What is needed is a gate drive which not only transforms the signal to the proper voltage differential and ground reference, but which provides isolation between the logic circuitry and the switching circuitry.

In order to deal with the above problem, the prior art discloses the use of various isolating elements, including opto-isolators and transformers. Opto-isolators, however, are known to introduce reliability problems. Transformers are difficult to miniaturize, and consequently are a significant cost item, and take up space. Although there has been a great deal of activity in miniaturizing transformers, it still remains a substantial problem to provide a low-cost transformer along with a low-cost drive circuit for driving the transformer primary so as to result in efficient coupling of the logic signal through to the transformer secondary. As examples of the prior art, reference is made to U.S. Pat. No. 3,760,198, Mori et at., which describes a standard transformer circuit producing sharp edge pulse transmission through the transformer, with circuitry for reshaping the pulses that are distorted in transmission through the transformer. Reference is also made to U.S. Pat. No. 4,433,719, Planer et at., showing standard pulse transformer techniques. In the area of transformer design, and particularly design of low-cost transformers suitable for gate drive circuits, reference is made to U.S. Pat. No. 4,342,143 to Jennings; U.S. Pat. No. 4,785,345 to Rawls et at.; U.S. Pat. No. 4,803,453, Tomono et al.; and U.S. Pat. No. 4,959,630, Yerman et at.

FIG. 1 shows a prior art gate drive circuit disclosed in pending U.S. application Ser. No. 939,311, now U.S. Pat. No. 5,399,913, assigned to the same assignee as this invention. As illustrated in FIG. 1, the two clock signal inputs provide a sharp edged carrier which is inputted to the input of transformer T1. The ENABLE signal, which is the logic signal to be transmitted through to the gate or other input node of the high voltage switching device, is inputted into the primary circuit so as to modulate the carrier. The modulated carder passes through the transformer to the secondary, and the circuitry between the transformer secondary and the output terminals at the gate drive (indicated as gate and emitter) performs the function of demodulating the waveform, shaping the signal, and deriving power from the signal passed through the transformer for switching the switching device. In this prior art circuit, each of the two transistors typically has to handle about 600 ma. Most of this current is magnetizing current required in order to produce a signal through the transformer.

In FIG. 1, transformer T1 is typically a conventional ferrite core, torroidal transformer. The transformer has few turns and a small core to keep the cost low. However, since this transformer has limited volt-second capability, the drive components must operate at high frequencies, e.g., 2 MHz. This type of construction tends to have significant magnetization current, requiring the components to switch at both high frequency and high current. Here, the primary drive components switch the transformer in a push-pull configuration, which causes the edges of the waveform to be sharp, or square. The emission spectrum of this type of circuit can cause unwanted frequencies in the hundreds of MHz range. In addition, the primary drive components must supply the load current and switch the substantial magnetizing current, which causes stress and tends to reduce overall reliability.

In order to provide a less expensive transformer, such as the type used in this invention, an air-core-type of transformer can be used. However, taking the core out of the transformer generally requires an even higher frequency, which in turn generally leads to a higher magnetization current requirement. Thus, the potential reduction of the expense involved in the transformer T1 by using a lower cost air-core transformer would be expected to result in even greater demands upon the drive circuitry for driving the transformer primary, which in turn would result in costs offsetting the cheaper transformer costs. Accordingly, what is required is an improved input or primary drive for a gate drive circuit, which solves the above problems and results in reduced cost. Such reduced cost is important in an apparatus such as an uninterrupted power supply (UPS), which may typically require three or four such gate drive circuits to couple low-level logic signals to high voltage switching devices.

SUMMARY OF THE INVENTION

It is an object of this invention to provide an improved gate drive which can be constructed at reduced cost compared to prior art drives, and which provides for reliable transmission of low-level logic signals to high-level switch devices.

In accordance with the above object, there is provided a reduced cost drive circuit which receives low-level input logic signals and provides output logic signals isolated from the input signal and adapted for driving high voltage switches. The circuit utilizes an inexpensive air-core-type transformer, having a primary and a secondary; an input (primary) drive circuit for receiving the low-level logic signals and coupling them to the transformer primary, the input logic circuit comprising an oscillator which includes a resonant circuit for producing a carrier signal, and an input coupling circuit for coupling the logic signal to modulate the carrier signal. The resonant circuit substantially provides the magnetization current, enabling a high frequency operation in combination with an air core transformer. The overall combination permits a substantially reduced cost gate drive circuit, and avoids the high frequency emission problems of prior art drive circuits.

DESCRIPTION OF THE PREFERRED EMBODIMENT

Figure 1:
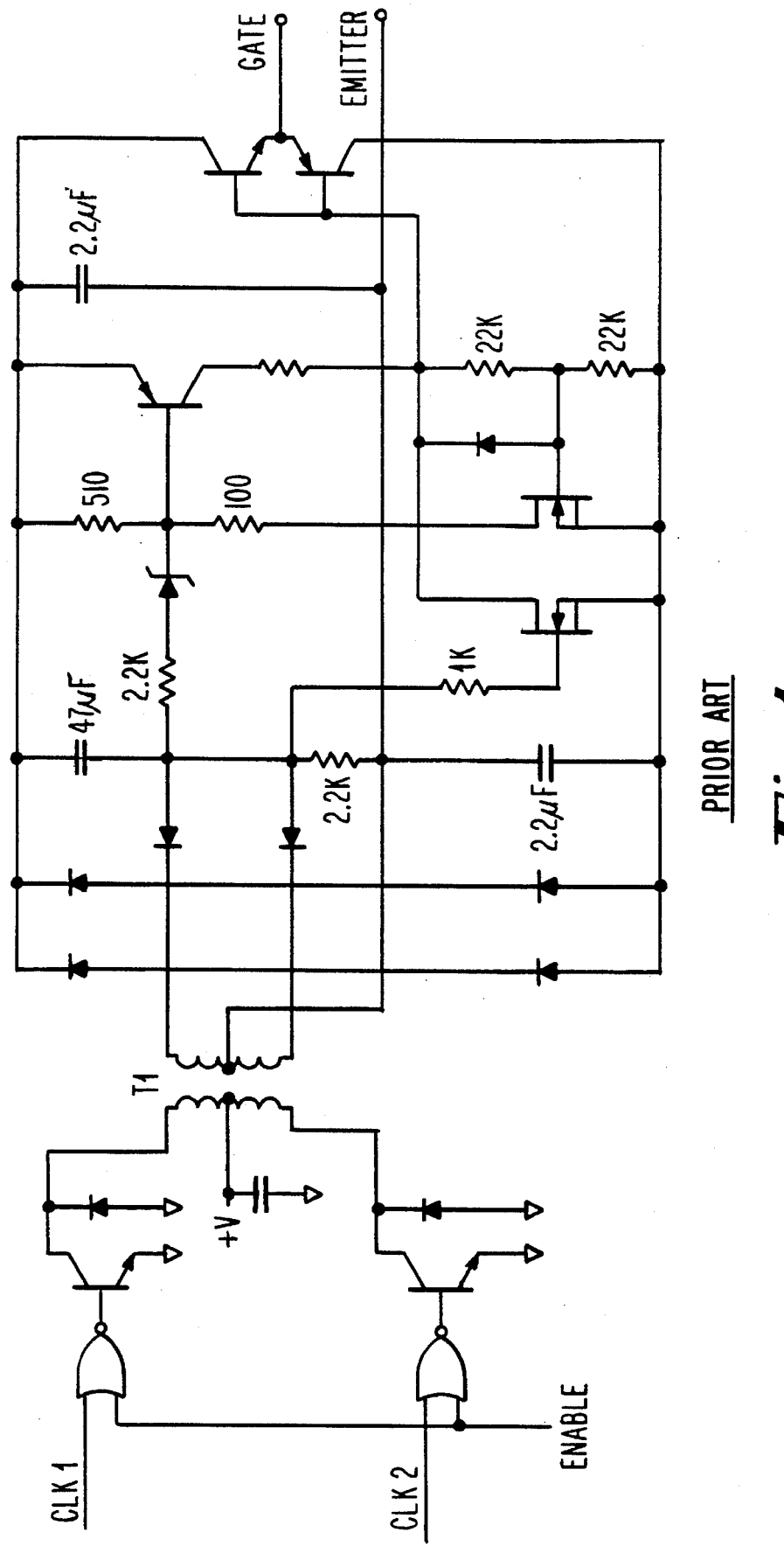
FIG. 1 illustrates a known prior art gate drive circuit.
Figure 2:
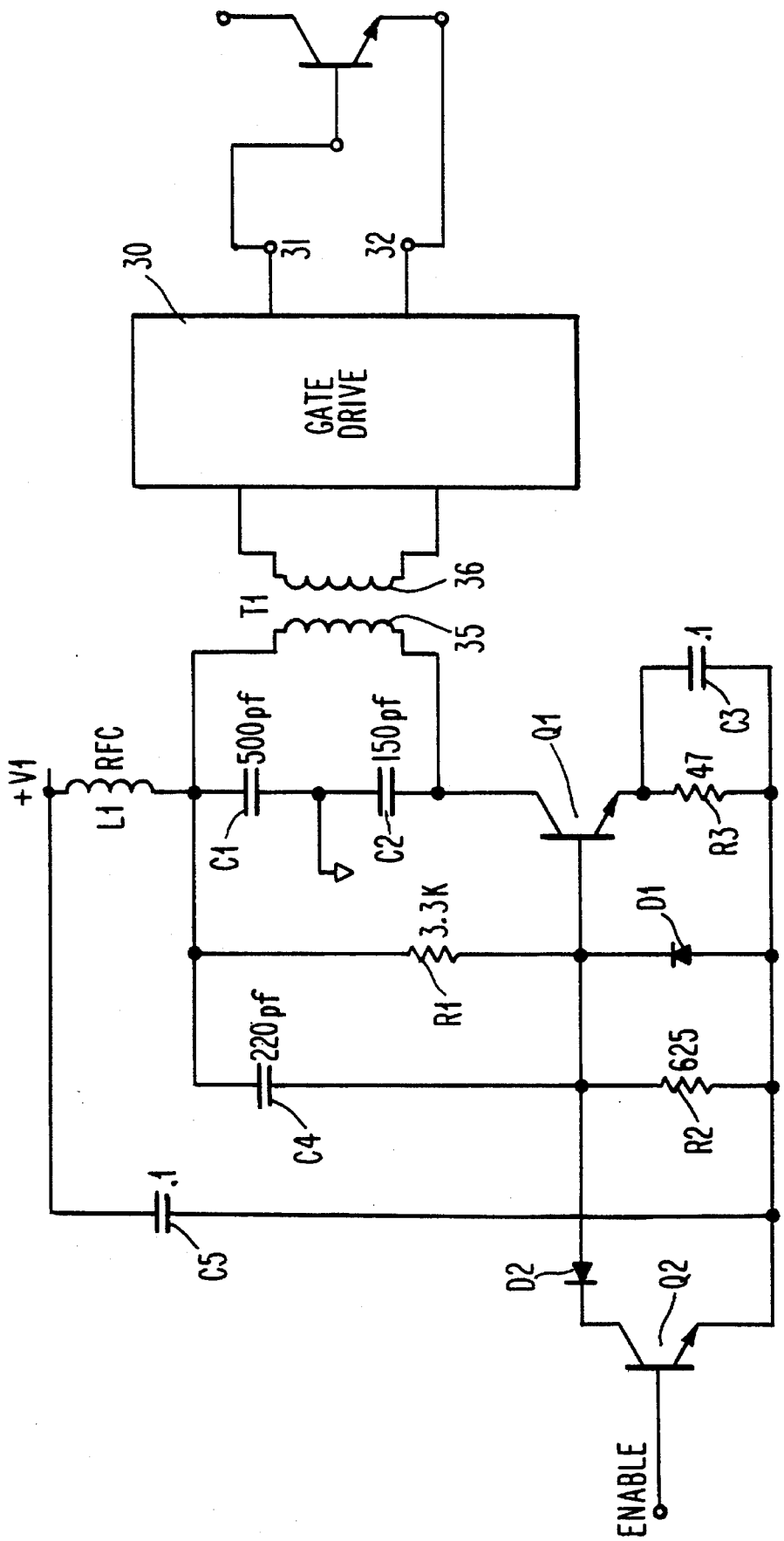
FIG. 2 presents a gate drive circuit having an improved input drive circuit in accordance with this invention.

Referring to FIG. 2, there is illustrated a circuit diagram of the improved input drive circuit in accordance with this invention. The input drive circuit takes the input logic signal, designated ENABLE, and encodes it onto a carrier signal, the modulated carrier signal being coupled through the transformer T1. The gate drive circuit 30 is a circuit such as illustrated in FIG. 1, and provides the final output drive signal to the switching device. The output is shown indicated across terminals 31 and 32, which may be the gate and emitter respectively of a high voltage switching transistor. The circuit of FIG. 2 thus provides high level switching signals across terminals 31, 32 which are derived from low level input logic signals. It is to be understood that while this invention is illustrated as a gate drive, it can be used for driving any switching devices, i.e., the input need not be coupled to an element designated as a gate. Typical high-side switches are MOSFET transistors and IGBTs.

Figure 3A:
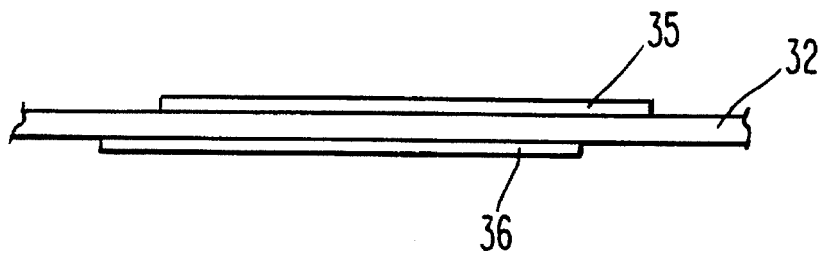
FIG. 3A is a cross-sectional representation of an air core transformer used in an embodiment of this invention.
Figure 3B:
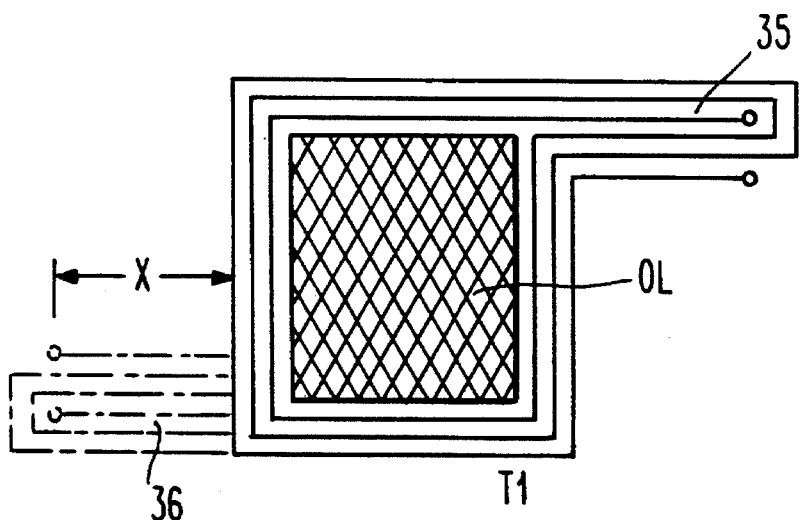
FIG. 3B is a plan view of the windings of the air core transformer of FIG. 3A.

Referring further to FIG. 2, it has been found that the cost of winding the coil can be reduced if the windings are placed on a printed circuit board, the primary placed on one side and the secondary on the other side. Due to the advantages of the input drive circuit of this invention, the increased magnetizing current of such a transformer is no longer a problem, such that the cost of coil winding is reduced to the cost of the printed circuit board area occupied by the windings. As illustrated in FIGS. 3A and 3B, a "pork-chop" construction permits the proper spacing of the windings using a two-layer PCB. As seen in FIG. 3A, PCB 32 has the primary winding 35 placed on one side, and the secondary 36 is placed in the other side. The primary and the secondary are displaced by a distance X, as illustrated in FIG. 3B, providing an area of overlap, which provides the necessary coupling. The extensions from the rectangular coils permit agency-required spacing to be maintained while facilitating ease of construction.

Referring again to FIG. 2, in the improved circuit, the input drive circuit components are not required to provide the magnetizing current, due to the fact that the transformer primary winding oscillates with the parallel capacitance C1, C2. Due to the circuit, the driver transistor Q1, when properly biased, sustains the oscillations. The driver transistor Q1 is modulated by coupling the ENABLE signal through to the base of transistor Q1, making it possible to provide substantially one hundred percent modulation. By this solution, the problem of removing the core has been solved, and the increase in magnetization current required by a higher frequency is no longer an obstacle in achieving proper drive.

Still referring to the circuit of FIG. 2, the oscillator selected for the primary drive is of the Colpits type. The oscillator comprises transistor Q1, which is biased in the linear region of operation by resistors R1, R2 and R3 as illustrated. Capacitor C1 and C2 are connected in series, to provide the resonant capacitance together with the primary 35 of transformer T1. Capacitor C3 is a bypass capacitor placed in parallel with emitter resistor R3. Feedback is applied to the base of transistor Q1 through capacitor C4, typically 220 pf. Inductor L1 is a radio frequency coil, permitting the AC voltage on the primary of the transformer to be decoupled from the power supply. Capacitor C5 is a high frequency bypass, on the order of 0.1 microfarads. The ENABLE signal is inputted to the base of transistor Q2, which has its emitter tied to logic ground. The collector of Q2 is connected through a diode D2 to the drive transistor Q1, the diode D2 being necessary to stop oscillation when the ENABLE signal is turned off.

The circuit of FIG. 2 operates at about 12 MHz, but requires a drive current of only about 100 ma. Since the resonant circuit, of which the primary provides the inductor, oscillates at the carrier frequency, it generates the magnetizing current continuously, the transistor only having to provide periodic small additional current inputs. Thus, the reduced cost air-core transformer can be utilized at the higher frequency, but without the sacrifice of requiring the greater current. Also, due to the nature of the resonant circuit, the sinusoidal voltage across the transformer primary winding minimizes the undesired emissions caused by the prior art circuits. Additionally, here the transformer need not be center tapped, which saves construction costs. Further, there is no necessity to generate clock signals for the carrier, since the resonant circuit itself produces the carrier.

There is thus disclosed an improved gate drive, which provides reliable operation at a reduced cost. The reduced cost is achieved by using a low-cost transformer in combination with an improved input (primary) drive circuit which minimizes required current.

Figure 4:
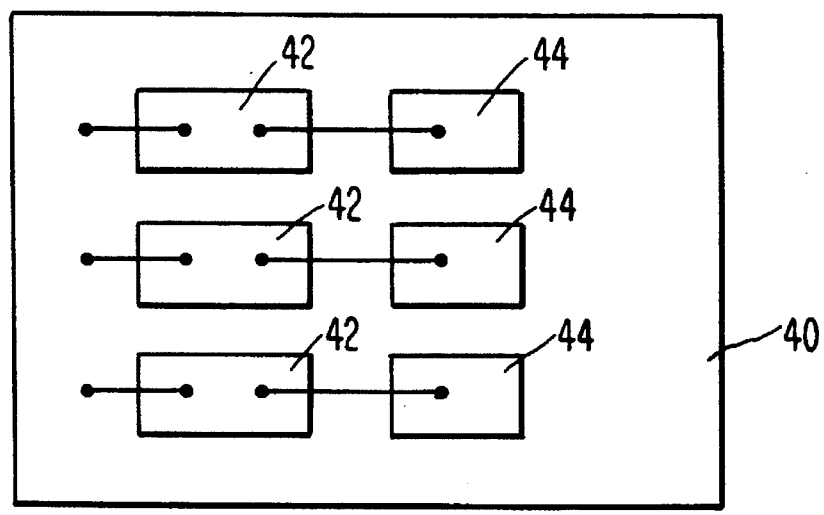
FIG. 4 is a representation of an uninterrupted power supply having a plurality of drive circuits of the type shown in FIG. 2.

Referring to FIG. 4, there is shown a representation of an uninterrupted power supply 40 having a plurality of gate drive circuits 42, each gate drive circuit being of the type shown in FIG. 2. Each circuit 42 receives a respective logic signal and drives a respective switching device 44 with a high level logic signal transformed from and isolated from its input logic signal.

What is claimed is:

1. A drive circuit for receiving a low-level input logic signal and transferring same into a high-level output logic signal isolated from the source of the input logic signal, said circuit having an input terminal for receiving said input logic signal and output terminals for providing said output logic signal to a switching device, said circuit further comprising:

a) a transformer having a primary and a secondary, b) an input drive circuit for receiving said input logic signal, said input drive circuit comprising an oscillator, said oscillator having a resonant circuit producing a carrier signal at a predetermined carrier frequency, said resonant circuit including said transformer primary, and connecting means for connecting said input logic signal to said oscillator so as to modulate said carrier signal, and c) an output drive circuit connected between said transformer secondary and said output terminals for demodulating the logic signal from said transformer secondary and providing a shaped logic signal to said output terminals.

2. The device circuit as described in claim 1, wherein said transformer is printed on a printed circuit board.

3. The drive circuit as described in claim 1, comprising a printed circuit (PC) board, and wherein said primary is printed on a first side of said PC and said secondary is printed on a second side of said PC.

4. The drive circuit as described in claim 1, wherein said oscillator comprises a switching element, and said connecting means couples said input logic signals to said switching element, whereby said oscillator is modulated at substantially 100% modulation.

5. An uninterrupted power supply having a plurality of high-level switching devices, and a plurality of drive circuits for driving said switching devices with respective high-level logic output signals derived from respective low-level input logic signals, each of said drive circuits having at least one output terminal, comprising:

a) a transformer having a primary and a secondary, b) an input drive circuit for receiving an input logic signal, said input drive circuit comprising an oscillator, said oscillator having a resonant circuit producing a carrier signal at a predetermined carrier frequency, said resonant circuit including said transformer primary, and connecting means for connecting said input logic signal to said oscillator so as to modulate said carrier signal, and c) an output drive circuit connected between said transformer secondary and an output terminal for demodulating the logic signal from said transformer secondary and providing a shaped logic signal to said output terminal.

6. A logic power supply that is operated from a low-level logic circuit which provides a source of logic signals, and providing at its output terminals high-level logic signals derived from said logic signals and isolated from the source of logic signals, comprising:

a) a transformer having a primary and a secondary, b) an input drive circuit coupling said source of logic signals to said transformer primary, said input drive circuit comprising an oscillator, said oscillator having a resonant circuit producing a carrier signal at a predetermined carrier frequency, said resonant circuit including said transformer primary, and c) an output circuit connected between said transformer secondary and said output terminals to couple high-level logic signals to said output terminals.

* * * * *